United States Patent [19]
Bothra

[11] Patent Number: 6,030,885
[45] Date of Patent: Feb. 29, 2000

[54] HEXAGONAL SEMICONDUCTOR DIE, SEMICONDUCTOR SUBSTRATES, AND METHODS OF FORMING A SEMICONDUCTOR DIE

[75] Inventor: Subhas Bothra, San Jose, Calif.

[73] Assignee: VLSI Technology, Inc., San Jose, Calif.

[21] Appl. No.: 08/844,076

[22] Filed: Apr. 18, 1997

[51] Int. Cl.⁷ .................................................. H01L 21/301
[52] U.S. Cl. .......................................... 438/460; 438/462
[58] Field of Search .................................... 438/460, 461, 438/462, 463, 464, 465; 257/620

[56] References Cited

U.S. PATENT DOCUMENTS

| | | |
|---|---|---|
| 4,499,607 | 2/1985 | Higgins . |
| 4,805,007 | 2/1989 | Schroeder . |
| 4,990,462 | 2/1991 | Sliwa, Jr. ................................. 438/107 |
| 5,462,217 | 10/1995 | Simmons et al. . |
| 5,543,365 | 8/1996 | Wills et al. . |
| 5,547,740 | 8/1996 | Higdon et al. . |
| 5,552,345 | 9/1996 | Schrantz et al. . |
| 5,710,071 | 1/1998 | Beddingfield et al. ................. 438/108 |
| 5,777,360 | 7/1998 | Rostoker et al. ........................ 257/665 |
| 5,859,448 | 1/1999 | Brassington ............................ 257/620 |

OTHER PUBLICATIONS

Edward H. Wong et al., "Laser Chip Separation Method For GaAs MMIC Wafers," 1988, pp. 113–116.

Peter A. Sandborn et al., "The Tradeoff Between Peripheral and Area Array bonding of Components in Multichip Modules," Jun. 1994, pp. 249–256.

S. Wolf, R. N. Tauber, "Silicon Processing for the VLSI Era," 1986, pp. 472–473.

*Primary Examiner*—Kevin M. Picardat
*Attorney, Agent, or Firm*—Wells, St. John, Roberts, Gregory & Matkin, P.S.

[57] ABSTRACT

The present invention provides for a hexagonal semiconductor die, semiconductor substrates and methods of forming a semiconductor die. One embodiment of the present invention provides a method of forming a semiconductor die comprising: providing a semiconductor wafer; forming an array of regular hexagonal dies upon the wafer, the array being formed in a two-dimensional honeycomb configuration; forming circuitry upon individual ones of the hexagonal dies; separating the hexagonal dies by laser cutting; and attaching a plurality of electrical contacts to the circuitry of individual ones of the hexagonal dies.

18 Claims, 4 Drawing Sheets

HEXAGONAL SEMICONDUCTOR DIE, SEMICONDUCTOR SUBSTRATES, AND METHODS OF FORMING A SEMICONDUCTOR DIE

TECHNICAL FIELD

The present invention relates to semiconductor die, semiconductor substrates and methods of forming semiconductor die.

BACKGROUND OF THE INVENTION

A major driving force in semiconductor technology is the integration of a larger electrical circuitry system into a single chip. There exist two general ways to achieve this goal including: 1) reducing the minimum feature size and 2) increasing the die size.

The pursuit of the goal to integrate a larger system within a single chip has resulted in numerous advancements. In particular, the aim to reduce the minimum feature size has led to the introduction of 0.35 micron technology in production. Further, the semiconductor industry is aggressively pursuing development of 0.25 micron and 0.18 micron technologies.

The goal of increasing die size has led to an increase in chip size. Currently, 450 mm$^2$ chips are produced and the size is projected to increase to 750 mm$^2$ by the year 2001.

The progress in both approaches identified above is today fundamentally dependent upon photolithographic capabilities. The method of reducing minimum feature size is determined by the resolution capability of the photolithography equipment. The method of increasing die size is limited by the field size of the photolithography equipment being utilized.

In particular, the maximum die size is limited by the stepper field size. The stepper field size is the circular field defined by the photolithography equipment optics. The physical laws governing optics mandate circular stepper fields.

FIG. 1 shows a semiconductor wafer 4 having an array 6 of conventional square dies 8 formed thereon. The portions of the substrate intermediate the perimeter of the semiconductor wafer 10 and the array 6 are often not utilized which results in a considerable amount of waste of expensive semiconductor materials.

The present invention is drawn towards providing an optimized die shape to maximize the die size for any particular photolithography capability.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the present invention, a method of forming a semiconductor die comprises: providing a semiconductor wafer; forming a hexagonal die upon the semiconductor wafer; and separating the hexagonal die from the semiconductor wafer.

A second aspect of the present invention provides a method of forming a plurality of semiconductor die comprising: providing a semiconductor substrate; and forming an array of hexagonal dies upon the semiconductor substrate.

Another aspect of the present invention provides a method of forming a semiconductor die comprising: providing a semiconductor wafer; forming an array of regular hexagonal dies upon the wafer, the array being formed in a two-dimensional honeycomb configuration; forming circuitry upon individual ones of the hexagonal dies; separating the hexagonal dies by laser cutting; and attaching a plurality of electrical contacts to the circuitry of individual ones of the hexagonal dies.

In accordance with another aspect of the present invention, a hexagonal semiconductor die is provided.

Yet another aspect of the present invention includes a semiconductor substrate comprising a plurality of hexagonal die.

The present invention provides one optimized die shape to maximize the die size for a given photolithographic capability. Maximum utilization of the semiconductor substrate is the first consideration in choice of die shape. A closely packed structure must be used to minimize or eliminate waste of the semiconductor substrate. The substrate may comprise one of two elemental semiconductors including germanium and silicon. Alternatively, the substrate may comprise a semiconducting compound, such as gallium arsenide (GaAs).

Figure 1:
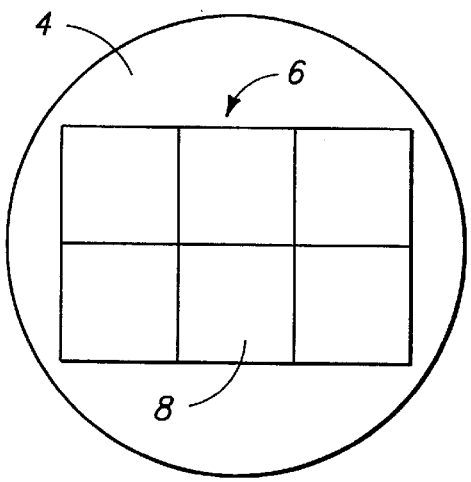
FIG. 1 is a plan view of a semiconductor wafer having an array of conventional square dies formed thereon.

For a two-dimensional geometry (e.g., a semiconductor wafer), there exist three basic regular polygons which permit 100% utilization of the substrate. Such polygons include an isosceles triangle, square and regular polygon. As previously mentioned, conventional dies are typically squares as shown in FIG. 1.

Figure 2:
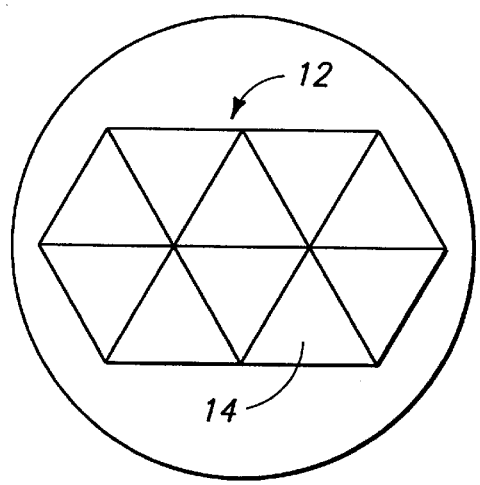
FIG. 2 is a plan view of a semiconductor wafer having an array of triangular dies formed thereon.
Figure 3:
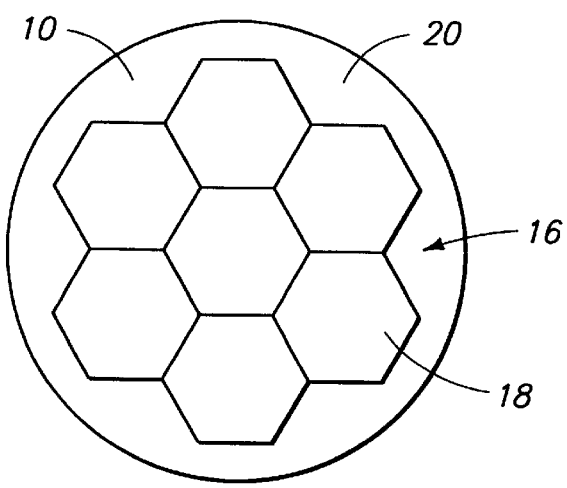
FIG. 3 is a plan view of a semiconductor wafer having an array of regular hexagonal dies formed thereon in accordance with one embodiment of the present invention.

Referring to FIG. 2–FIG. 3, additional arrays of various dies are shown. FIG. 2 shows a semiconductor wafer 10, such as silicon, having an array 12 of triangular dies 14 formed thereon. The triangular dies 14 are isosceles triangles. The process of forming such an array 12 comprising a plurality of triangular dies 14 includes the added complexity of required rotation of the photolithography optics between adjacent dies 14. In order to provide complete utilization of the substrate, the optics are rotated between adjacent dies to appropriately project the desired image upon the surface of the semiconductor wafer 10.

FIG. 3 shows an embodiment of the present invention. An upper surface 20 of the semiconductor wafer 10 has an array 16 of dies formed thereon. Array 16 includes a plurality of regular hexagonal dies 18. The hexagonal dies 18 within array 16 are preferably closely packed as shown in FIG. 3 to provide maximum individual die size and minimum waste of the semiconductor substrate. Preferably, array 16 of a plurality of regular hexagonal dies 18 forms a two-dimensional honeycomb configuration as shown in FIG. 3.

The formation of circuitry upon the semiconductor wafer 10 can be performed utilizing photolithographic methods. During photolithographic formation of circuitry, a mask is used to define circuitry upon the surface 20 of the semiconductor wafer 10. In particular, optics are utilized to project a mask image onto the surface 20 of semiconductor wafer 10.

The illustrated embodiment employs a projection exposure system which uses refractive optics to project the mask image onto the upper surface 20 of the semiconductor wafer 10. The exposure system is utilized to project the mask image onto only a portion of the semiconductor wafer 10 inasmuch as it is impracticably complex to produce a lens capable of projecting the desired mask image over an entire surface of a 100 mm$^2$ or larger semiconductor wafer 10.

With the use of a step-and-repeat projection aligner, referred to herein as a stepper, the stepper field is subsequently stepped and repeated across the semiconductor wafer 10. The utilization of a stepper aligner to project the image onto the semiconductor wafer 10 removes wafer size as a limitation.

Figure 4:
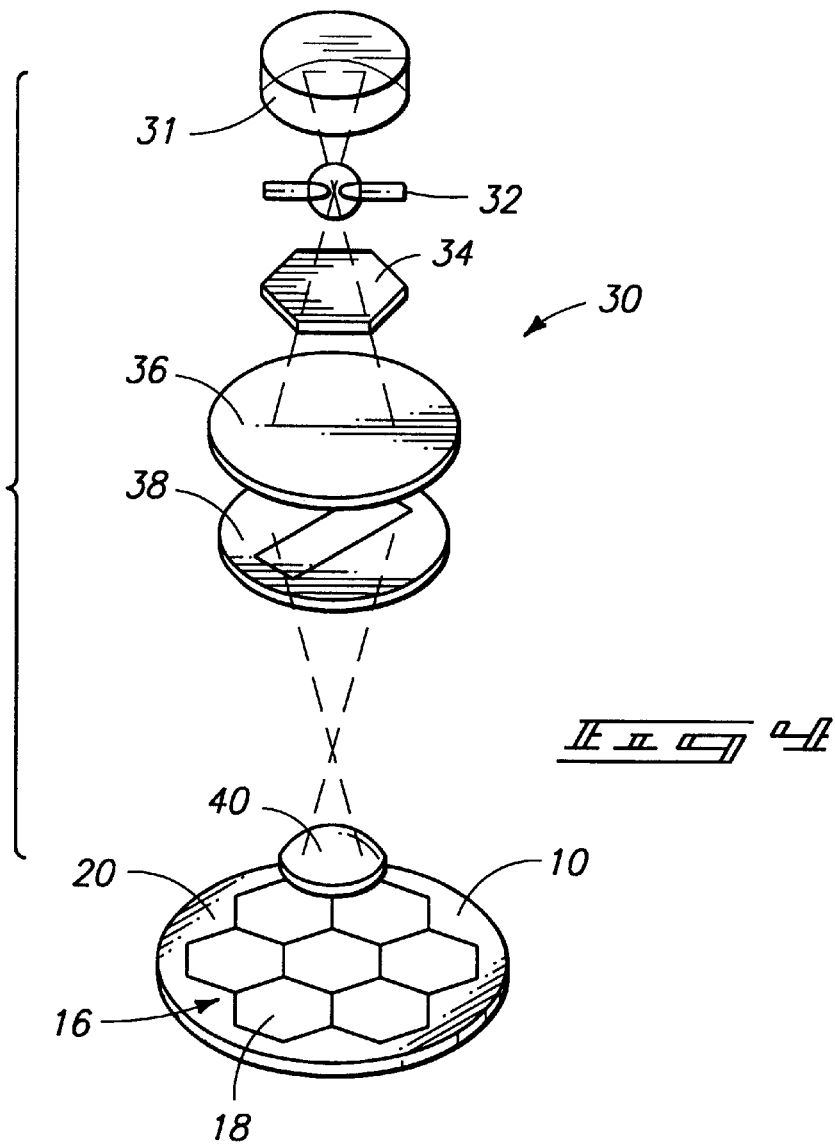
FIG. 4 is a perspective illustrative view of a typical step-and-repeat projection aligner.

Referring to FIG. 4, a stepper 30 includes a mirror 31, Hg arc lamp 32, filter 34, condenser lens system 36, mask 38 and reduction lens system 40. Light emitted from the Hg arc lamp 32 is directed towards filter 34. Further, light reflected within mirror 31 is directed towards filter 34. The light is filtered and enters condenser lens system 36 before passing through the mask 38. Reduction step and repeat projection aligners employ reticles having patterns which are enlargements of the desired image. The projected image from the mask 38 is reduced within the reduction lens system 40 before application to semiconductor wafer 10. Such steppers 30 provide enhanced image resolution. Further, stepping each hexagonal die 18 permits correction for wafer distortion.

Alternatively, non-reduction step-and-repeat projection aligners may be utilized. Such systems use a 1:1 catadioptric optical system rather than a reduction lens. In such systems, the optical effects of defects cannot be decreased by reduction, and defect-free recticles are therefore required.

Figure 5:
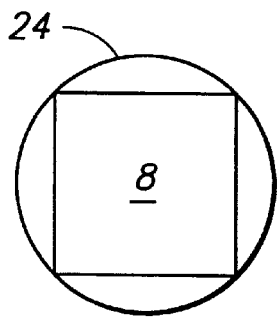
FIG. 5 is a plan view of a square die within a given stepper field.
Figure 6:
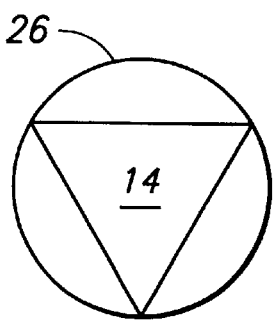
FIG. 6 is a plan view of a triangular die within a given stepper field.
Figure 7:
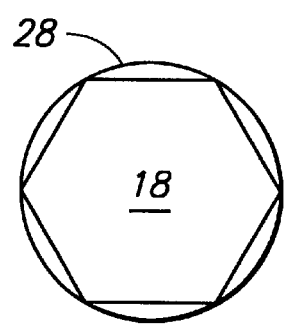
FIG. 7 is a plan view of a hexagonal die within a given stepper field.

Referring to FIG. 5–FIG. 7, various shaped dies 8, 14, 18 are shown within corresponding circular optical stepper fields 24, 26, 28. The maximum die size is limited by the field size of the stepper. The maximum die size in terms of surface area is determined by the largest polygon that can be inscribed within the corresponding circular stepper field.

FIG. 5 shows a stepper field 24 and a square die 8 inscribed therein. FIG. 6 shows a stepper field 26 and an isosceles triangle die 14 inscribed therein. FIG. 7 shows a stepper field 28 and a regular hexagonal die 28 inscribed therein.

From a comparison of the dies 8, 14, 18 shown in FIG. 5–FIG. 7, utilization of a regular hexagonal die 18 provides a larger surface area compared with the surface areas of a square die 8 and triangular die 14 inscribed within a stepper field of identical diameter. It follows that for a stepper field of a given maximum diameter (as defined by the optics of the photolithography equipment), the regular hexagonal die 18 provides the maximum surface area compared with the square die 8 and isosceles triangle die 14.

Figure 8:
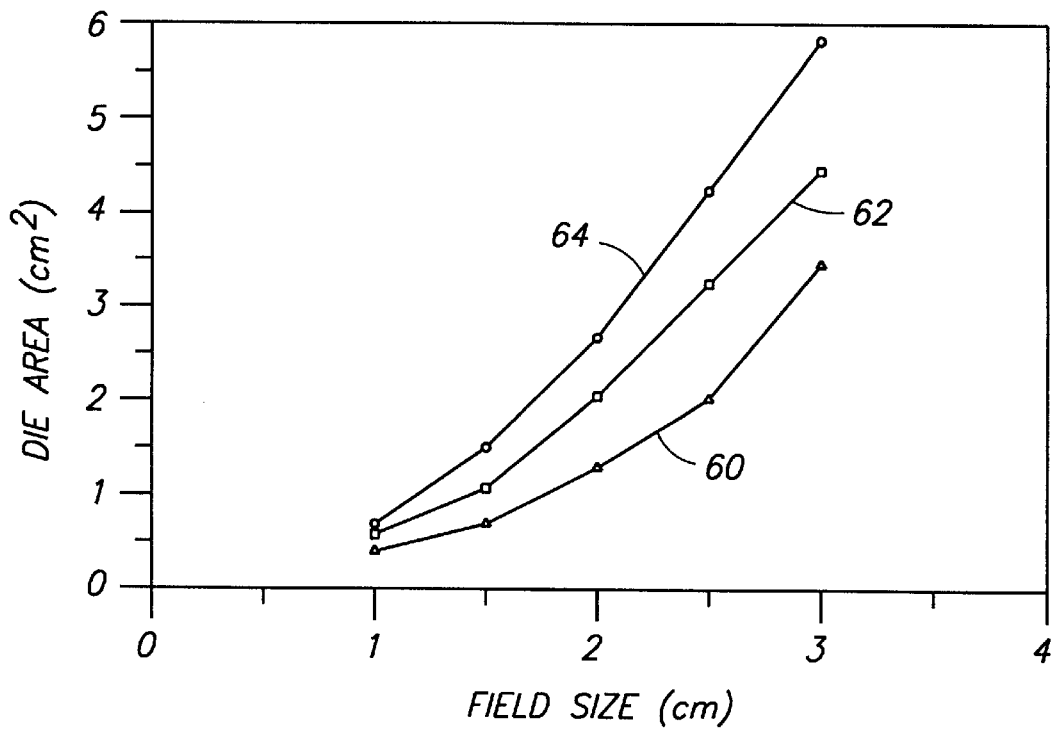
FIG. 8 is a graphical representation of die area of a square die, triangular die and hexagonal die as a function of field size.

Referring to FIG. 8, the maximum die areas that can be manufactured as a function of field size for the square die 8, isosceles triangular die 14 and regular hexagonal die 18 are shown in a graphical illustration. The diameter of the stepper field is indicated in centimeters on the abscissa of the graph and surface area of a corresponding die is indicated in square centimeters on the ordinate of the graph. Line 60 represents the maximum surface area of the isosceles triangular die 14 for a given range of stepper fields. Line 62 represents the maximum surface area of the square die 8 for the given range of stepper fields. Line 64 represents the maximum surface area of the regular hexagon semiconductor die 18 for the given range of stepper fields.

As indicated in the graph, a regular hexagonal die 18 provides greater surface area than the triangular die 14 or square die 8 for a given diameter (i.e., stepper field). For example, providing a stepper field of 2 cm yields a triangular die 14 having an approximate die area of 1.25 cm$^2$, a square die 8 having an approximate die area of 2.0 cm$^2$, and a hexagonal die 18 having an approximate die area of 2.6 cm$^2$. FIG. 8 illustrates the advantages of utilizing a die 18 in the shape of a regular hexagon to provide a semiconductor die having increased surface area for a given photolithography technology having a fixed stepper field size.

Figure 9:
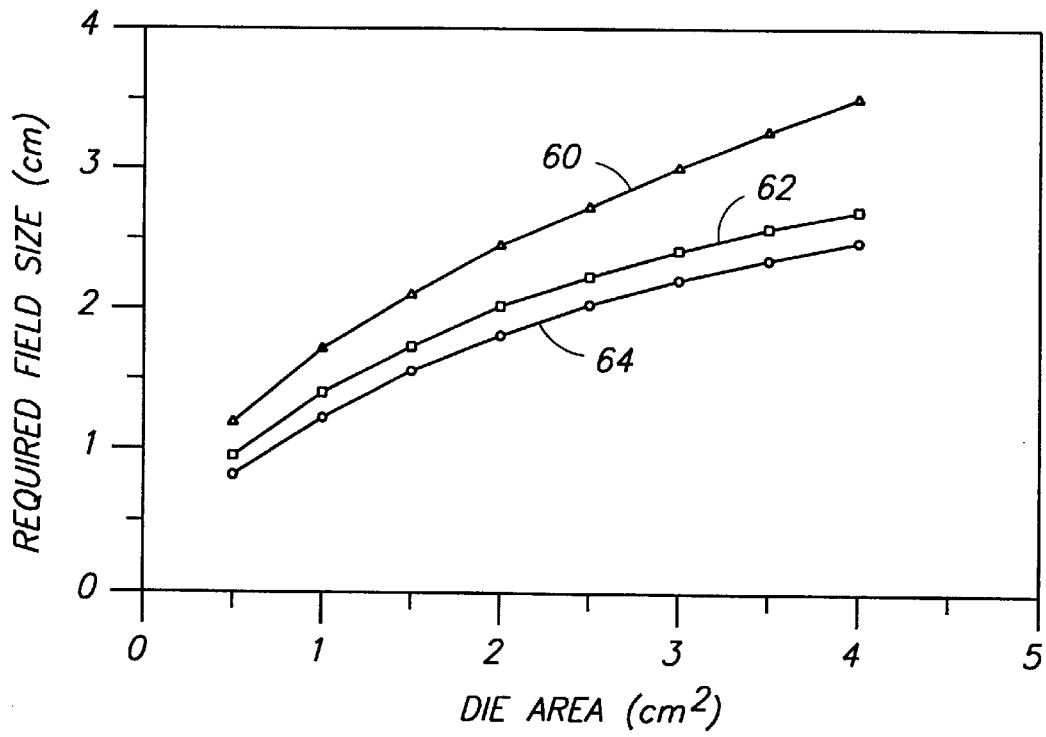
FIG. 9 is a graphical representation of required stepper field size for a square die, triangular die and hexagonal die as a function of die area.

FIG. 9 illustrates the required stepper field size as a function of die area for the various semiconductor die geometries discussed herein. The abscissa of the graph indicates the die area in square centimeters. The ordinate of the graph indicates the corresponding required stepper field size diameter in centimeters.

Line 60 represents the required stepper field size for a range of surface areas of a triangular die 14. Line 62 represents the required stepper field size for a range of surface areas of a square die 8. Line 64 represents the required stepper field size for a range of surface areas of a hexagonal die 18. It is readily seen from FIG. 8 that the regular hexagon die 18 according to the present invention provides increased die surface area compared with the triangular die 14 and square die 8 for any given stepper field size.

Figure 10:
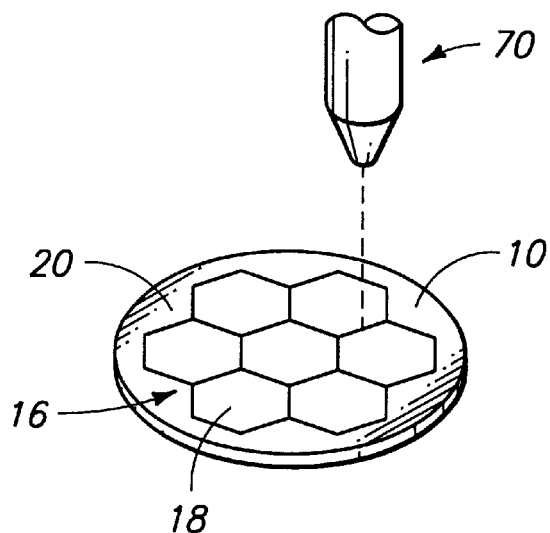
FIG. 10 is a perspective view illustrating laser separation of hexagonal dies.

Following the formation of a plurality of integrated circuits upon respective dies of the semiconductor wafer 10, the dies are separated to form chips which may be subsequently packaged for commercial use. It is preferred to utilize laser cutting techniques for separating the dies inasmuch as conventional sawing techniques would be difficult at best for separating the hexagon dies 18. More particularly, in the illustrated embodiment, laser 70 is used to separate the hexagonal dies 18 as shown in FIG. 10. Such laser techniques utilize a suitable laser, such as Nd-YAG laser, for die separation.

The use of laser 70 is advantageous inasmuch as the laser 70 may be programmed to cut any pattern desired. Such separation techniques eliminate the need to lay out circuitry in a straight grid pattern as is typically required in saw separation applications. Separation of dies through the use of a laser provides increased yield and is repeatable. Laser separation techniques additionally eliminate physical damage to the chip since no pressure or mechanical force is applied to the semiconductor wafer 10.

Figure 11:
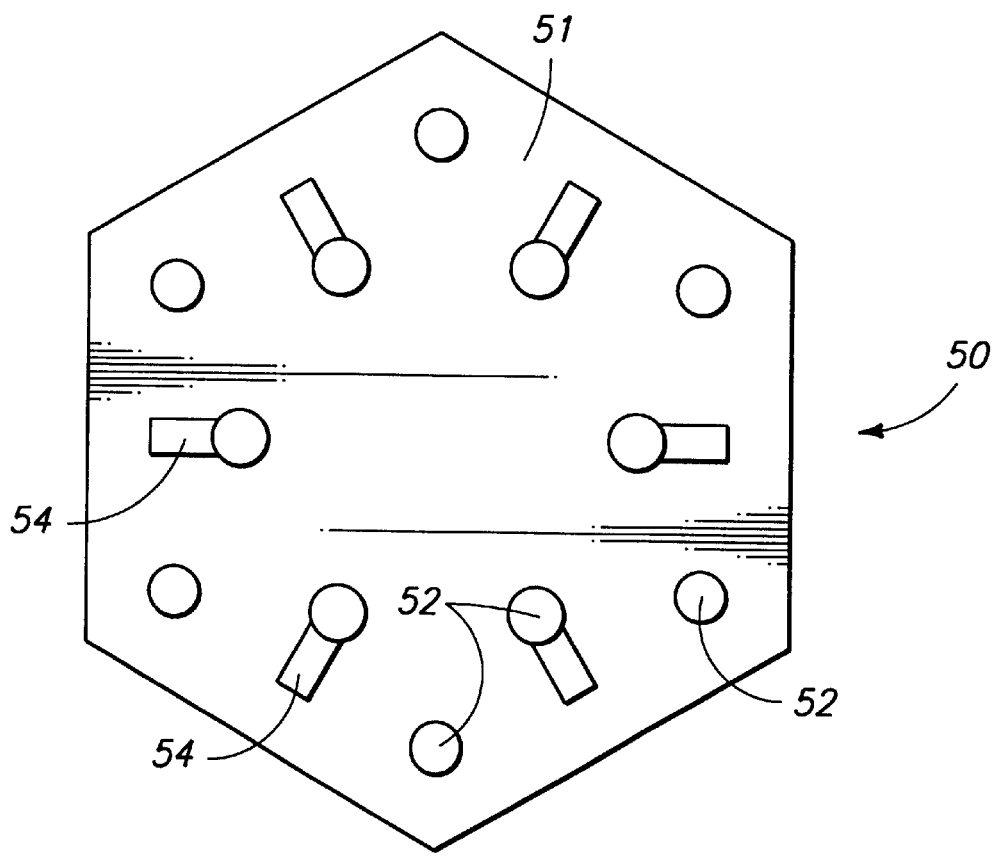
FIG. 11 is a plan view of a hexagonal die formed as a flip chip having a plurality of electrical contacts and electrical runners formed upon an upper surface of the chip.

Referring to FIG. 11, it is preferred to utilize a hexagonal die 14 in a flip chip 50 configuration. The flip chip 50 shown has a plurality of electrical contacts 52, also referred to as leads or bond pads, and a plurality of electrical runners 54. Flip chip configurations 50 enable the utilization of the entire surface 51 of the chip to provide electrical connection to the integrated circuitry contained within the chip. In particular, the electrical contacts 52 may be disposed across the entire surface 51 of the chip.

Typically, conventional chips only utilize the perimeter of the chip to provide electrical connection to the integrated circuitry within the chip. Through the fabrication of hexagonal flip chips 50, additional electrical contacts 52 may be provided to provide additional electrical connections to the integrated circuitry. The electrical runners 54 connect electrical contacts 52 provided upon the interior portions of the surface 51 of the chip with the perimeter of the chip. It follows that it is preferred to fabricate semiconductor circuits utilizing a hexagonal die 18 in accordance with the present invention in a flip chip configuration to maximize the number of external electrical contacts 52 which may be made between the exterior of the chip and the integrated circuitry within the interior of the chip.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a plurality of semiconductor dies comprising:
   providing a semiconductor wafer;
   forming an array of regular hexagonal dies upon the wafer, the array being formed in a two-dimensional honeycomb configuration;
   forming circuitry upon individual ones of the hexagonal dies;
   separating the hexagonal dies by laser cutting; and
   attaching a plurality of electrical contacts to the circuitry of individual ones of the hexagonal dies.

2. A method of forming a plurality of semiconductor dies comprising:
   providing a semiconductor substrate;
   forming an array of hexagonal dies upon the semiconductor substrate; and
   separating the hexagonal dies to form integrated circuits.

3. The method according to claim 2 wherein the separating comprises laser cutting.

4. The method according to claim 2 wherein the hexagonal dies are arranged in a honeycomb configuration.

5. The method according to claim 4 wherein the honeycomb configuration is two dimensional.

6. The method according to claim 2 wherein the hexagonal dies individually include a surface and further comprising forming a plurality of electrical contacts upon the individual surfaces of the hexagonal dies to define flip chips.

7. The method according to claim 6 further comprising forming a plurality of electrical runners upon the individual surfaces of the hexagonal dies.

8. The method according to claim 2 wherein the hexagonal dies are regular hexagons.

9. A method of forming a plurality of semiconductor dies comprising:
   providing a semiconductor wafer;
   forming an array of regular hexagonal dies upon the wafer by photolithography using a stepper having a circular optical field, the array being formed in a two-dimensional honeycomb configuration;
   separating the hexagonal dies by laser cutting; and
   attaching a plurality of leads to individual ones of the hexagonal dies to define flip chips.

10. A semiconductor substrate comprising a plurality of hexagonal dies arranged in a honeycomb configuration.

11. The semiconductor substrate according to claim 10 wherein the substrate is selected from the group consisting of silicon, germanium and gallium arsenide.

12. The semiconductor substrate according to claim 10 wherein the hexagonal dies are regular hexagons.

13. The semiconductor substrate according to claim 10 wherein the honeycomb configuration is two dimensional.

14. An integrated circuit package comprising:
   a single hexagonal semiconductor die containing integrated circuitry; and
   a plurality of electrical contacts electrically coupled with the integrated circuitry and a surface of the hexagonal semiconductor die to form a flip chip.

15. The integrated circuit package according to claim 14 further comprising electrical runners provided upon a surface of the hexagonal die.

16. A method of forming a circuit comprising:
   providing a hexagonal semiconductor die in a honeycomb configuration;
   electrically coupling the hexagonal die with circuitry external of the hexagonal die; and
   spacing the hexagonal die from other integrated circuitry during the coupling.

17. The method according to claim 16 further comprising coupling a plurality of electrical contacts with circuitry of the hexagonal die.

18. The method according to claim 16 wherein the providing comprises:
   providing a semiconductor wafer;
   forming an array of hexagonal dies upon the wafer;
   forming circuitry upon at least one of the hexagonal dies; and
   separating the at least one hexagonal die having circuitry from the other hexagonal dies using laser cutting.

* * * * *